(12) United States Patent
Okubo

(10) Patent No.: US 9,564,546 B2
(45) Date of Patent: Feb. 7, 2017

(54) INTERCONNECTOR

(75) Inventor: Mitsuru Okubo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 528 days.

(21) Appl. No.: 12/994,515

(22) PCT Filed: Jul. 10, 2009

(86) PCT No.: PCT/JP2009/062593
§ 371 (c)(1),
(2), (4) Date: Nov. 24, 2010

(87) PCT Pub. No.: WO2010/007946
PCT Pub. Date: Jan. 21, 2010

(65) Prior Publication Data
US 2011/0067746 A1    Mar. 24, 2011

(30) Foreign Application Priority Data

Jul. 16, 2008  (JP) ................................. 2008-185074

(51) Int. Cl.
*H01L 31/05* (2014.01)
*H01L 27/142* (2014.01)

(52) U.S. Cl.
CPC ....... *H01L 31/0508* (2013.01); *H01L 27/1421* (2013.01); *Y02E 10/50* (2013.01)

(58) Field of Classification Search
CPC ... H01L 31/05; H01L 31/0504; H01L 31/0508
(Continued)

(56) References Cited

U.S. PATENT DOCUMENTS 2,668,241 A * 2/1954 Skinner ......................... 250/296
3,422,213 A * 1/1969 Boodley ................... H01B 5/02
                                                                174/126.1
(Continued)

FOREIGN PATENT DOCUMENTS

DE        39 02 838 A1   8/1989
DE    10 2006 049603 A1   4/2008
(Continued)

OTHER PUBLICATIONS

Machine Translation of JP2007-287861A.*
(Continued)

*Primary Examiner* — Marla D McConnell
*Assistant Examiner* — Sadie White
(74) *Attorney, Agent, or Firm* — Oblon, McClelland, Maier & Neustadt, L.L.P.

(57) ABSTRACT

An interconnector for electrically connecting a first electronic device element and a second electronic device element includes first and second connection portions which are respectively connected to electrodes of the first and second electronic device elements. A plurality of strip-like intermediate portions are each connected to both the first connection portion and the second connection portion to electrically connect the first connection portion and the second connection portion. The intermediate portions are mutually separated from one another in the width direction and mutually extending in parallel directions. Each intermediate portion has a first curved portion which is curved to be concave at one side of the respective intermediate portion in the width direction, and a second curved portion which is curved to be concave at another side of the respective intermediate portion in the width direction.

10 Claims, 7 Drawing Sheets

(58) Field of Classification Search
USPC .......................................................... 136/244
See application file for complete search history.

(56) References Cited

U.S. PATENT DOCUMENTS

| | | | |
|---|---|---|---|
| 4,118,643 A * | 10/1978 | Coppa et al. ................... | 310/11 |
| 6,034,322 A * | 3/2000 | Pollard .......................... | 136/256 |
| 6,359,209 B1 * | 3/2002 | Glenn et al. ................... | 136/256 |
| 6,610,919 B2 | 8/2003 | Ohkubo | |
| 2004/0094195 A1 | 5/2004 | Kuechler | |
| 2007/0199592 A1 | 8/2007 | Agui et al. | |
| 2009/0159116 A1 | 6/2009 | Umetani et al. | |
| 2009/0318037 A1 * | 12/2009 | Wirth ........................... | 439/884 |

FOREIGN PATENT DOCUMENTS

| | | | | |
|---|---|---|---|---|
| EP | 1 037 309 A2 | 9/2000 | | |
| JP | 62 128573 | 6/1987 | | |
| JP | 6 196744 | 7/1994 | | |
| JP | 2002 117033 | 6/2002 | | |
| JP | 2002-171033 A | 6/2002 | | |
| JP | 2005 56805 | 3/2005 | | |
| JP | 2007 227786 | 9/2007 | | |
| JP | 2007287861 A * | 11/2007 | ............. | H01L 31/04 |
| WO | 2007 043562 | 4/2007 | | |
| WO | WO 2008046648 A2 * | 4/2008 | | |

OTHER PUBLICATIONS

Japanese Office Action issued Jan. 29, 2013 in Patent Application No. 2010-520847 with English Translation.
International Search Report issued Sep. 15, 2009 in PCT/JP09/062593 filed Jul. 10, 2009.
Extended European Search Report issued Aug. 6, 2013 in European Patent Application No. 09797871.2.

* cited by examiner

INTERCONNECTOR

TECHNICAL FIELD

The present invention relates to an interconnector which electrically connects a first electronic device element and a second electronic device element.

BACKGROUND ART

There has conventionally been known an interconnector for electrically connecting a first solar cell and a second solar cell which includes: a first connection portion connected to an electrode of the first solar cell; a second connection portion connected to an electrode of the second solar cell; and a strip-like intermediate portion provided between the first connection portion and the second connection portion to electrically connect the first connection portion and the second connection portion, and curved to have the shape of the letter U in section along the longitudinal direction so that the intermediate portion is warped and deformed to suit the distance between the first solar cell and the second solar cell (see Patent Literature 1, for example).

When the first solar cell, the second solar cell, and the interconnector undergo a change in temperature, their different thermal expansion coefficients create a difference between the amount of deformation of the interconnector which is caused by the temperature change and the amount of deformation of the first solar cell and the second solar cell which is caused by the temperature change. However, with the intermediate portion warped and deformed to suit the distance between the first solar cell and the second solar cell, stress generated between the first solar cell and the first connection portion and between the second solar cell and the second connection portion is reduced.

CITATION LIST

Patent Literature

Patent Literature 1: JP 62-128573 A

SUMMARY OF INVENTION

Technical Problem

However, a problem in this case is that, because the intermediate portion has the shape of the letter U in section, a larger space is necessary to attach the interconnector.

The present invention has been made to solve the above-mentioned problem and an object of the present invention is therefore to provide an interconnector capable of reducing stress that is generated between a first electronic device element and a first connection portion and between a second electronic device element and a second connection portion without needing a larger space for attachment.

Solution to Problem

An interconnector for electrically connecting a first electronic device element and a second electronic device element according to the present invention includes: a first connection portion which is connected to an electrode of the first electronic device element; a second connection portion which is connected to an electrode of the second electronic device element; and a plurality of strip-like intermediate portions which are provided in parallel between the first connection portion and the second connection portion to electrically connect the first connection portion and the second connection portion, in which each of the plurality of intermediate portions has a first curved portion which is curved in one width direction and a second curved portion which is curved in another width direction opposite from the one width direction.

Advantageous Effects of Invention

According to the interconnector of the present invention, each of the plurality of intermediate portions has the first curved portion which is curved in one width direction and the second curved portion which is curved in another width direction opposite from the one width direction. Therefore, stress generated between the first electronic device element and the first connection portion and between the second electronic device element and the second connection portion caused by difference of thermal expansion between the interconnector and a covering or supporting part attached to both the first electronic device and the second electronic device can be reduced without needing a larger space for attachment.

DESCRIPTION OF EMBODIMENTS

Embodiments of the present invention are described below with reference to the drawings. Throughout the drawings and the description, the same or equivalent members and parts are denoted by the same symbols.

First Embodiment

Figure 1:
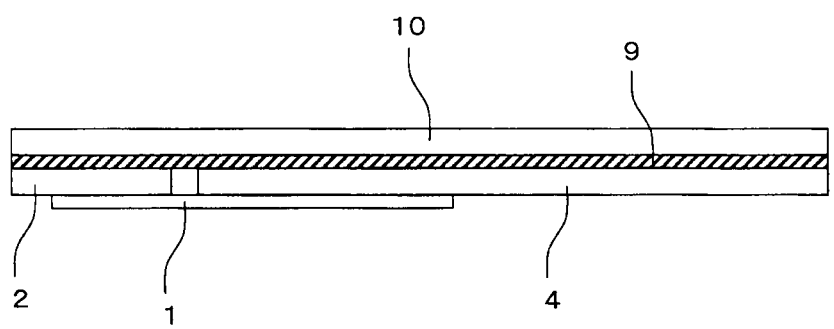
FIG. 1 A side view illustrating an interconnector according to a first embodiment of the present invention, a diode and a solar cell to which the interconnector is attached, and others.
Figure 2:
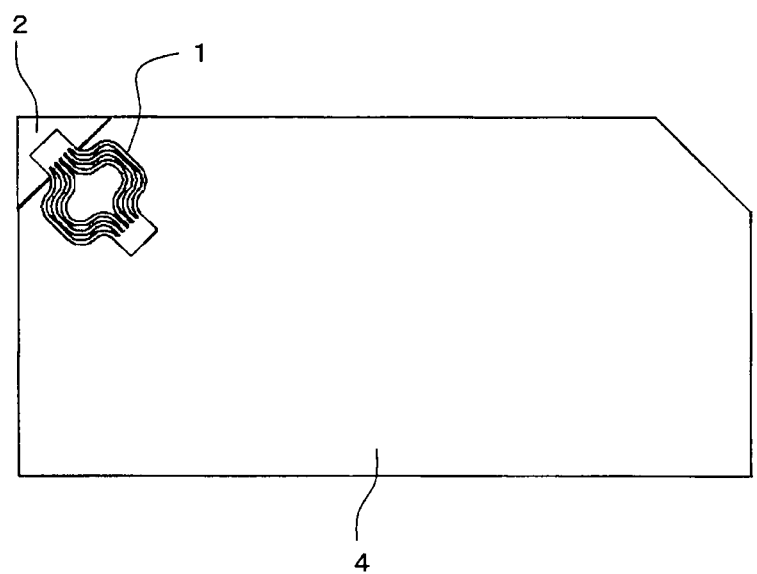
FIG. 2 A bottom view illustrating the interconnector, the diode, and the solar cell of FIG. 1.
Figure 3:
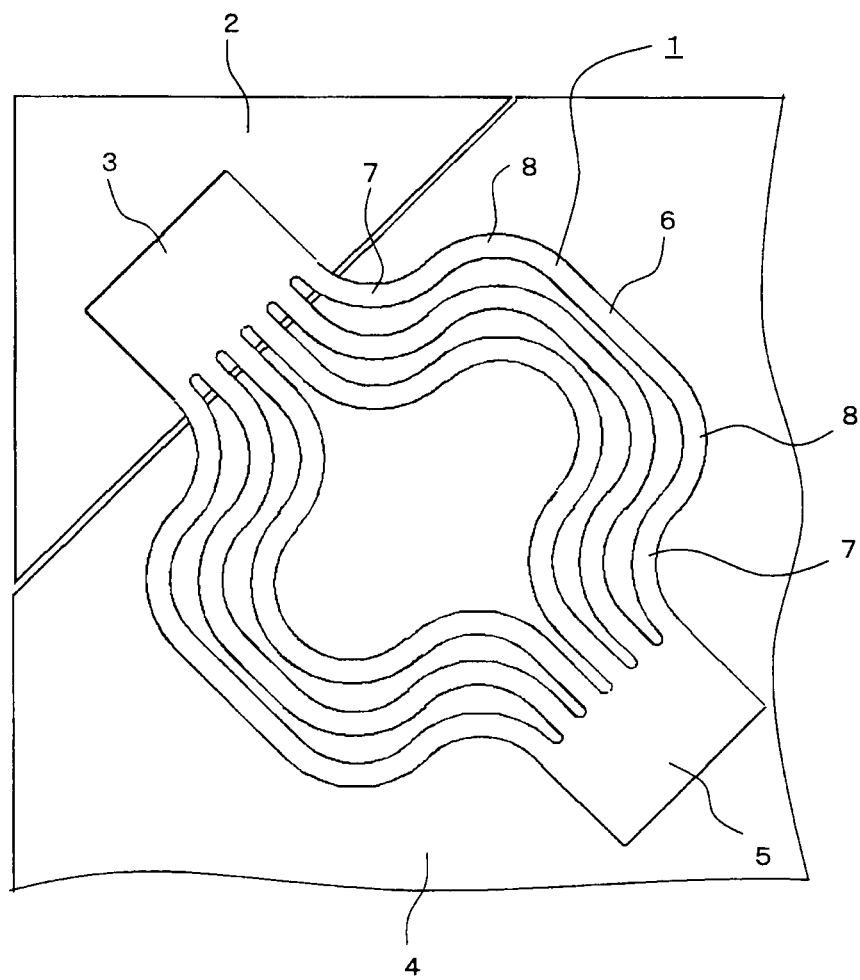
FIG. 3 An enlarged view illustrating a main part of the interconnector, the diode, and the solar cell of FIG. 2.

FIG. 1 is a side view illustrating an interconnector 1 according to this embodiment, a diode 2 and a solar cell 4 to which the interconnector 1 is attached, and others. FIG. 2 is a bottom view illustrating the interconnector 1, the diode 2, and the solar cell 4 of FIG. 1. FIG. 3 is an enlarged view illustrating a main part of the interconnector 1, the diode 2, and the solar cell 4 of FIG. 2.

The interconnector 1 according to this embodiment includes: a first connection portion 3 connected to an electrode of the diode 2, which is a first electronic device element and shaped like a flat board; a second connection portion 5 connected to an electrode of the solar cell 4, which is a second electronic device element placed on the same plane as the diode 2 and shaped like a flat board; and six strip-like intermediate portions 6 disposed in parallel between the first connection portion 3 and the second connection portion 5 to electrically connect the first connection portion 3 and the second connection portion 5.

The interconnector 1 is formed of a metal whereas the diode 2 and the solar cell 4 are formed of a semiconductor.

The solar cell 4 is a photovoltaic device and converts sunlight into electricity, but is damaged by voltage application in reverse. The diode 2 therefore prevents the application of reverse voltage to the solar cell 4.

Of the six parallel intermediate portions 6, three are placed on one side of a center line which runs along the longitudinal direction of the interconnector 1, and the remaining three are placed on the other side so that the three intermediate portions 6 and the remaining three intermediate portions 6 are the reversal of each other with respect to the center line.

The three parallel intermediate portions 6 on one side each have: first curved portions 7 provided at an end on the side of the first connection portion 3 and an end on the side of the second connection portion 5 both and curved in one width direction; and two second curved portions 8 provided between the two first curved portions 7 and curved in another direction which is opposite from the one direction.

The number of the first curved portions 7 and the number of the second curved portions 8 are not limited to two and may be a different number.

The first curved portions 7 and the second curved portions 8 are curved such that an angle formed between a straight line that connects a start point and a center of curvature and a straight line that connects an endpoint and the center of curvature is equal in the first curved portions 7 and the second curved portions 8.

The interconnector 1 is provided on one side of the diode 2 and the solar cell 4, and a cover glass 10 is attached via a cover glass adhesive 9 to the other side of the diode 2 and the solar cell 4 which is opposite from the interconnector 1.

When the interconnector 1, the diode 2, the solar cell 4, and the cover glass 10 undergo a change in temperature, their different thermal expansion coefficients create a difference between the amount of deformation of the interconnector 1 which is caused by the temperature change and the amount of deformation of the diode 2, the solar cell 4, and the cover glass 10 which is caused by the temperature change.

However, the intermediate portions 6 are deformed to suit the distance between the diode 2 and the solar cell 4, to thereby reduce stress generated between the diode 2 and the first connection portion 3 and between the solar cell 4 and the second connection portion 5.

Rigidity of the intermediate portions 6 is in proportion to the third power of their dimensions in the width direction. The intermediate portions 6 are therefore deformed more easily as their dimensions in the width direction become smaller.

Accordingly, compared to a single intermediate portion that has a given sectional area, for example, three intermediate portions created by dividing the single intermediate portion such that their total sectional area is the same as the given sectional area are reduced in overall equivalent spring constant to $\frac{1}{9}$. As a result, the stress generated between the diode 2 and the first connection portion 3 and between the solar cell 4 and the second connection portion 5 is reduced to $\frac{1}{9}$.

As has been described, the interconnector 1 according to this embodiment includes a plurality of strip-like intermediate portions 6 each of which has the first curved portions 7 curved in one width direction and the second curved portions 8 curved in another direction opposite from the one direction. The stress generated between the diode 2 and the first connection portion 3 and between the solar cell 4 and the second connection portion 5 can be thus reduced without needing a larger space to attach the interconnector 1.

The lifetime of the interconnector 1 is prolonged as a result.

In addition, because the first curved portions 7 and the second curved portions 8 are curved such that an angle formed between the straight line that connects the start point and the center of curvature and the straight line that connects the end point and the center of curvature is equal in the first curved portions 7 and the second curved portions 8, the first connection portion 3 and the second connection portion 5 can be positioned to face each other.

Moreover, the intermediate portions 6 each having two first curved portions 7 and two second curved portions 8 are more effective in reducing the stress that is generated between the diode 2 and the first connection portion 3 and between the solar cell 4 and the second connection portion 5 than intermediate portions each having one first curved portion 7 and one second curved portion 8.

Second Embodiment

Figure 4:
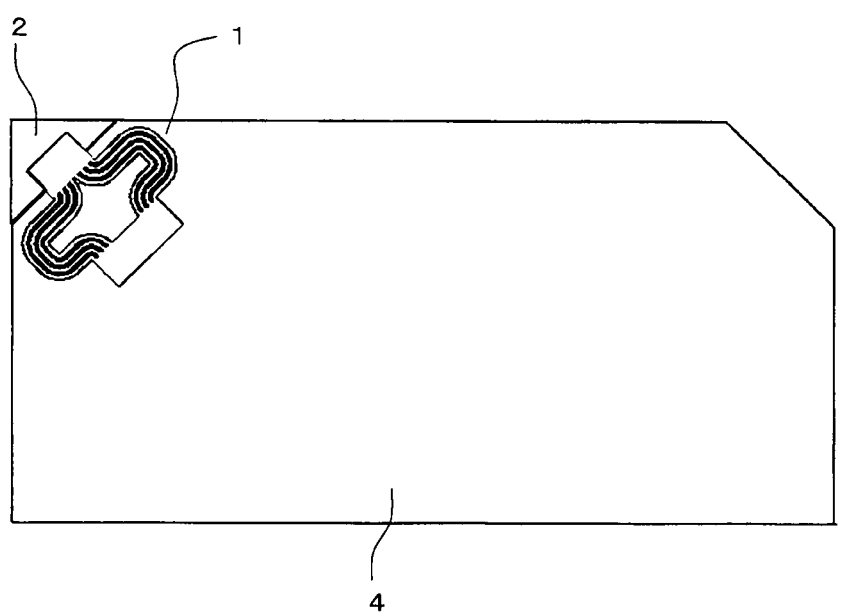
FIG. 4 A bottom view illustrating an interconnector according to a second embodiment of the present invention, and a diode and a solar cell to which the interconnector is attached.
Figure 5:
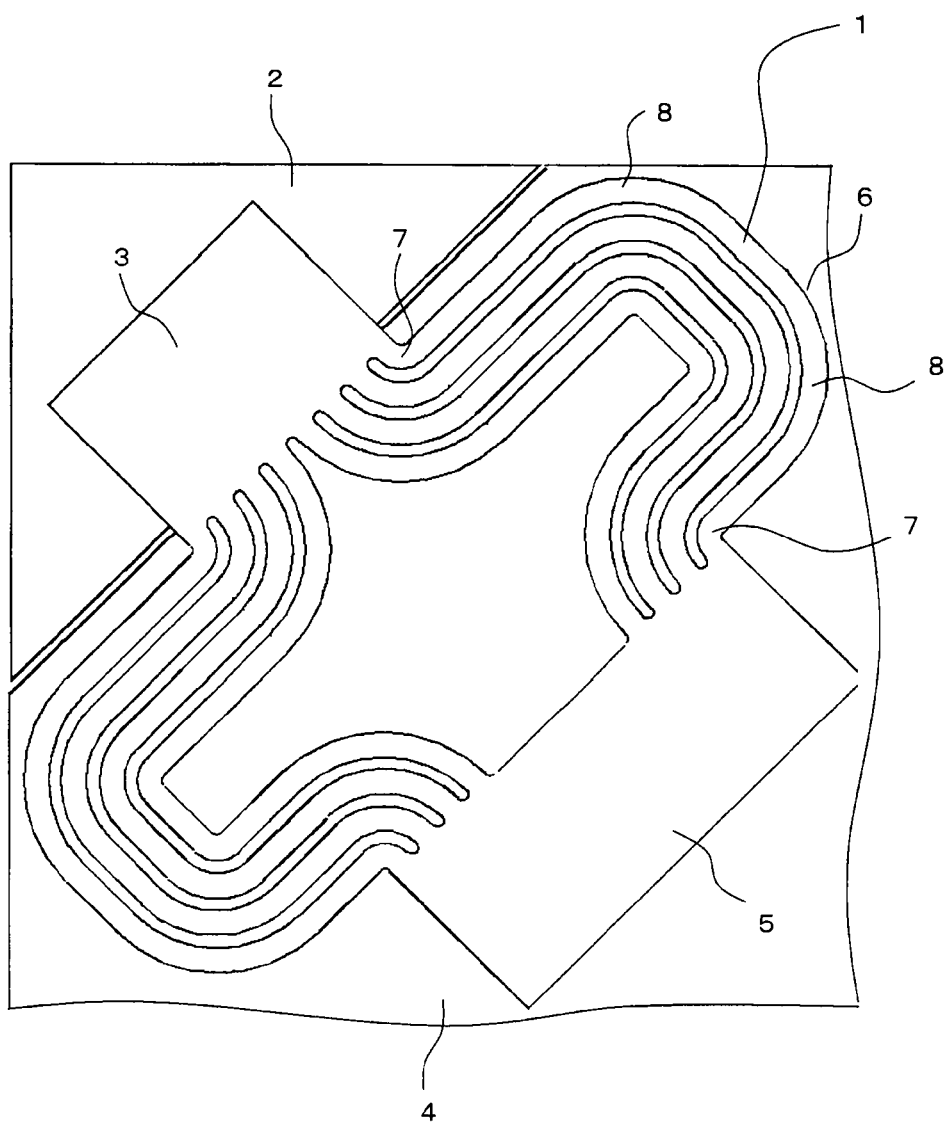
FIG. 5 An enlarged view illustrating a main part of the interconnector, the diode, and the solar cell of FIG. 4.

FIG. 4 is a bottom view illustrating an interconnector 1 according to this embodiment, and a diode 2 and a solar cell 4 to which the interconnector 1 is attached. FIG. 5 is an enlarged view illustrating a main part of the interconnector 1, the diode 2, and the solar cell 4 of FIG. 4.

The interconnector 1 according to this embodiment includes eight parallel, strip-like intermediate portions 6. Of the eight intermediate portions 6, four are placed on one side of a center line which runs along the longitudinal direction of the interconnector 1, and the remaining four are placed on the other side so that the four intermediate portions 6 and the remaining four intermediate portions 6 are the reversal of each other with respect to the center line.

In any two adjacent intermediate portions 6, first curved portions 7 of one are adjacent to first curved portions 7 of the other, and second curved portions 8 of one are adjacent to second curved portions 8 of the other.

Any two adjacent first curved portions 7 are shaped into arcs that have the same center of curvature, and the difference in radius of curvature between any two adjacent first curved portions 7 is constant.

Any two adjacent second curved portions 8 are shaped into arcs that have the same center of curvature, and the difference in radius of curvature between any two adjacent second curved portions 8 is constant.

The outside dimensions of the interconnector 1 are thus reduced.

Of four parallel intermediate portions 6, the two outer intermediate portions 6 are equal to each other in equivalent spring constant, and the two inner intermediate portions 6 are equal to each other in equivalent spring constant as well. This makes the equivalent spring constant of the two intermediate portions 6 on one side out of four parallel intermediate portions 6 equal to the equivalent spring constant of the two intermediate portions 6 on the other side.

The rest of the structure is the same as the structure in the first embodiment.

In the interconnector 1 according to this embodiment, the first curved portions 7 of one of any two adjacent intermediate portions 6 are adjacent to the first curved portions 7 of the other intermediate portion 6 and the second curved portions 8 of one of the two intermediate portions 6 are adjacent to the second curved portions 8 of the other intermediate portion 6. Any two adjacent first curved portions 7 are shaped into arcs that have the same center of curvature, and the difference in radius of curvature between any two adjacent first curved portions 7 is constant. Any two adjacent second curved portions 8 are shaped into arcs that have the same center of curvature, and the difference in radius of curvature between any two adjacent second curved portions 8 is constant. A gap between adjacent intermediate portions 6 can thus be narrowed, thereby reducing the outside dimensions of the interconnector 1.

Third Embodiment

Figure 6:
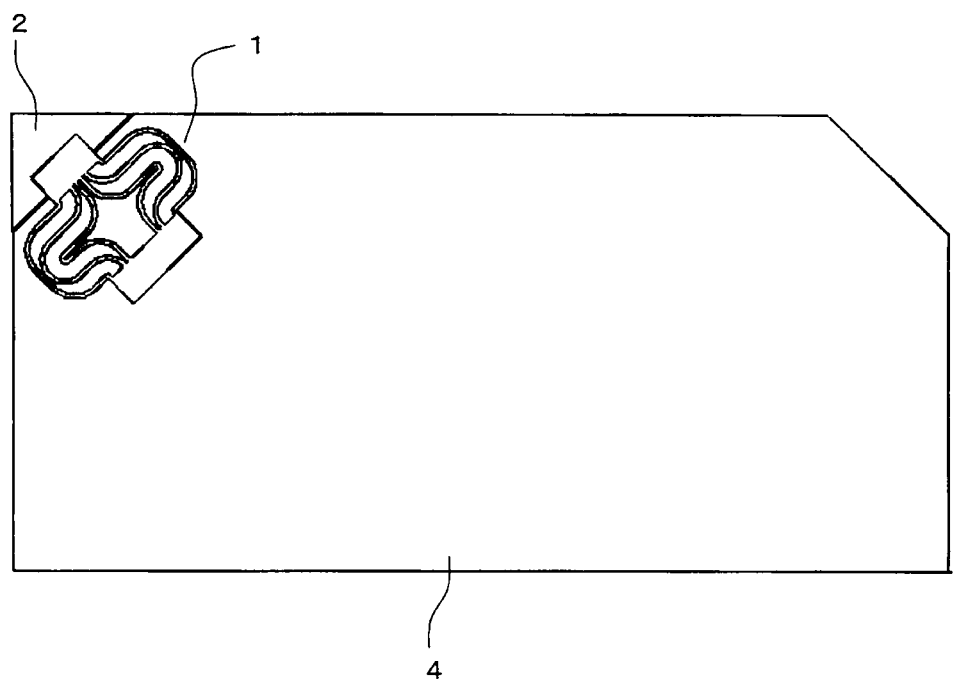
FIG. 6 A bottom view illustrating an interconnector according to a third embodiment of the present invention, and a diode and a solar cell to which the interconnector is attached.
Figure 7:
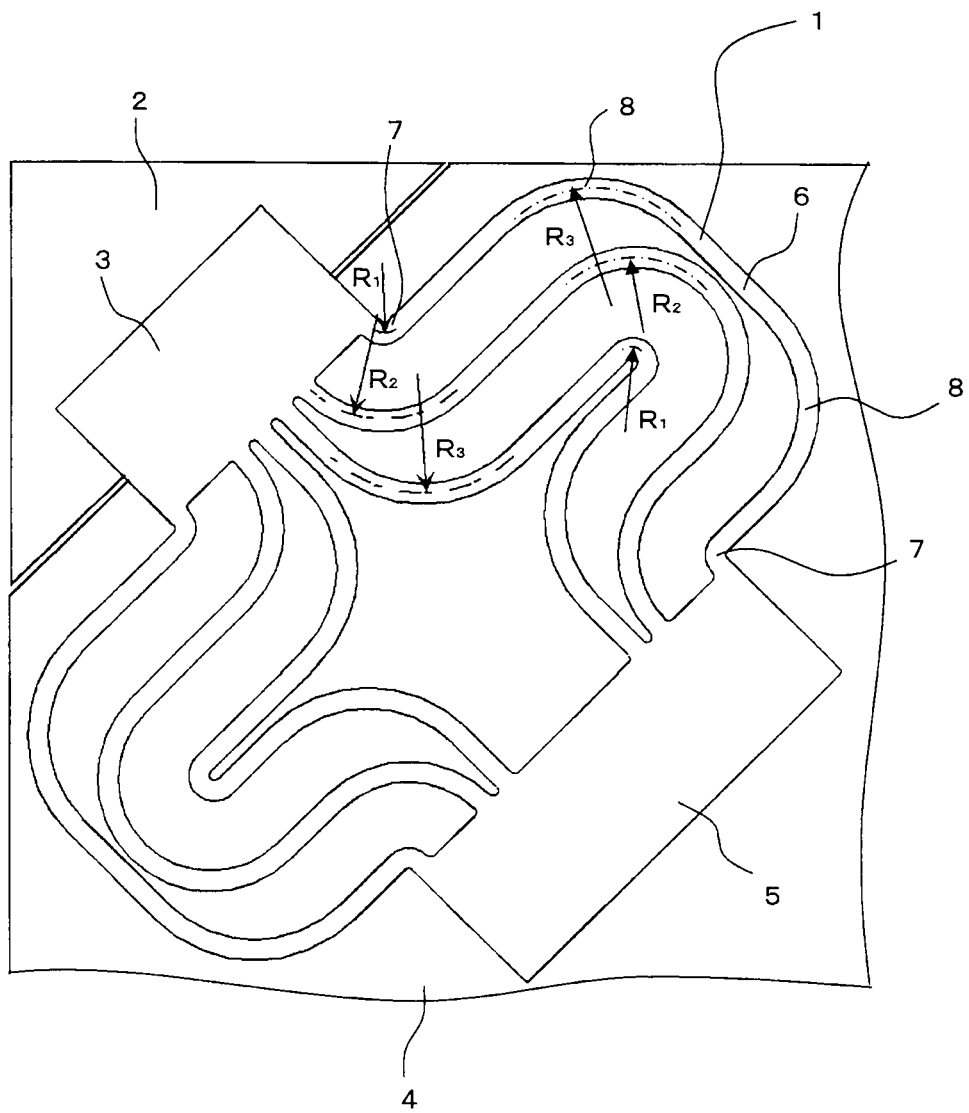
FIG. 7 An enlarged view illustrating a main part of the interconnector, the diode, and the solar cell of FIG. 6.

FIG. 6 is a bottom view illustrating an interconnector 1 according to this embodiment, and a diode 2 and a solar cell 4 to which the interconnector 1 is attached. FIG. 7 is an enlarged view illustrating a main part of the interconnector 1, the diode 2, and the solar cell 4 of FIG. 6.

The interconnector 1 according to this embodiment includes six parallel, strip-like intermediate portions 6. Of the six intermediate portions 6, three are placed on one side of a center line which runs along the longitudinal direction of the interconnector 1, and the remaining three are placed on the other side so that the three intermediate portions 6 and the remaining three intermediate portions 6 are the reversal of each other with respect to the center line.

The intermediate portions 6 each have an equal value as the combined value of the third power of the radius of curvature of first curved portions 7 and the third power of the radius of curvature of second curved portions 8.

Specifically, when R1 and R3 are respectively given as the radius of curvature of each first curved portion 7 and the radius of curvature of each second curved portion 8 in one of three intermediate portions 6 that is farthest from the center line running in the longitudinal direction of the interconnector 1, R2 and R2 are respectively given as the radius of curvature of each first curved portion 7 and the radius of curvature of each second curved portion 8 in its adjacent intermediate portion 6, and R3 and R1 are respectively given as the radius of curvature of each first curved portion 7 and the radius of curvature of each second curved portion 8 in the intermediate portion 6 that is closest of the three to the center line running along the longitudinal direction of the interconnector 1, the combined value of the third power of R1 and the third power of R3 in the farthest intermediate portion 6 is equal to the combined value of the third power of R2 and the third power of R2 in the adjacent intermediate portion 6, and also equal to the combined value of the third power of R3 and the third power of R1 in the closest intermediate portion 6.

The intermediate portions 6 each have a straight line portion between one first curved portion 7 and one second curved portion 8 which runs in a direction orthogonal to the longitudinal direction of the interconnector 1, and the length of the straight line portion is equal in each intermediate portion 6.

The equivalent spring constant of each intermediate portion 6 is in proportion to the sum of: the combined value of the third power of the radius of curvature of the first curved portions 7 and the third power of the radius of curvature of the second curved portions 8; and the combined value of the third power of the straight line portions running in a direction orthogonal to the longitudinal direction of the interconnector 1 which is the load direction. The equivalent spring constant is therefore equal in each intermediate portion 6.

The rest of the structure is the same as the structure in the first embodiment.

In the interconnector 1 according to this embodiment, the intermediate portions 6 each have an equal value as the combined value of the third power of the radius of curvature of the first curved portions 7 and the third power of the radius of curvature of the second curved portions 8, and the equivalent spring constant is therefore equal in each intermediate portion 6.

As a result, the stress can be reduced between the diode 2 and the first connection portion 3 and between the solar cell 4 and the second connection portion 5 which is generated due to a difference in equivalent spring constant among the intermediate portions 6.

The first electronic device element and the second electronic device element which are the diode 2 and the solar cell 4, respectively, in the embodiments described above are not limited thereto. For example, the first electronic device element and the second electronic device element may be a first solar cell and a second solar cell, respectively.

REFERENCE SIGNS LIST 1, interconnector; 2, diode (first electronic device element); 3, first connection portion; 4, solar cell (second electronic device element); 5, second connection portion; 6, intermediate portion; 7, first curved portion; 8, first curved portion; 9, cover glass adhesive; and 10, cover glass.

The invention claimed is:

1. An interconnector electrically connecting a first planar electronic device element and a parallel arranged second planar electronic device element which is separated from the first planar electronic device element in a direction of separation that is parallel to the planes of the first and second electronic device elements, wherein a width direction is perpendicular to the direction of separation, the interconnector comprising:

a first connection portion which is structurally connected directly to an electrode of the first electronic device element;

a second connection portion which is structurally connected directly to an electrode of the second electronic device element; and a first plurality of strip-like intermediate portions which are each structurally connected directly to both the first connection portion and the second connection portion and which each extends from the first connection portion to the second connection portion to electrically connect the first connection portion and the second connection portion, the intermediate portions of all of the first plurality of strip-like intermediate portions being mutually separated from one another in the width direction and mutually extending in parallel directions;

a second plurality of strip-like intermediate portions which are each structurally connected directly to both the first connection portion and the second connection portion and extend between the first connection portion and the second connection portion to electrically connect the first connection portion and the second connection portion, the second plurality of strip-like intermediate portions being mutually separated in the width direction and mutually extending in substantially parallel directions, wherein the second plurality of strip-like intermediate portions form a mirror image of the first plurality of strip-like intermediate portions with respect to a center line of the interconnector in the width direction, wherein, in each of the first plurality of strip-like intermediate portions and second plurality of strip-like intermediate portions, each intermediate portion has a plurality of first curved portions which are curved to be concave at one side of the respective intermediate portion in the width direction, and a plurality of second curved portions which are curved to be concave at another side of the respective intermediate portion in the width direction, wherein two of the second curved portions of each intermediate portion are arranged along the length of the respective strip-like intermediate portion and are provided between two of the first curved portions along the length of the respective strip-like intermediate portion, with no first curved portion being provided between the two of the second curved portions along the length of the respective strip-like intermediate portion, and wherein only end portions of the interconnector are structurally fixed to either of the first electronic device element or the second electronic device element through the first interconnection portion or the second interconnection portion, wherein, in any two adjacent intermediate portions of the first plurality of intermediate portions, a first curved portion of one intermediate portion and a first curved portion of another intermediate portion are adjacent to each other and a second curved portion of one intermediate portion and a second curved portion of the another intermediate portion are adjacent to each other, wherein any two adjacent first curved portions are shaped into arcs that have the same center of curvature, and a difference in radius of curvature between any two adjacent first curved portions is constant, wherein any two adjacent second curved portions are shaped into arcs that have the same center of curvature, and a difference in radius of curvature between any two adjacent second curved portions is constant, and wherein the intermediate portions each have a straight line portion between one first curved portion and a second curved portion, which straight line portions run in the width direction, and the length of the straight line portions in all of the intermediate portions is equal.

2. An interconnector according to claim 1, wherein an angle formed between a straight line that connects a start point and a center of curvature and a straight line that connects an end point and the center of curvature is equal in the first curved portion and the second curved portion of each intermediate portion of the first plurality of intermediate portions.

3. An interconnector electrically connecting a first planar electronic device element and a parallel arranged second planar electronic device element which is separated from the first planar electronic device element in a direction of separation that is parallel to the planes of the first and second electronic device elements, wherein a width direction is perpendicular to the direction of separation, the interconnector comprising:

a first connection portion which is structurally connected directly to an electrode of the first electronic device element;

a second connection portion which is structurally connected directly to an electrode of the second electronic device element; and a first plurality of strip-like intermediate portions which are each structurally connected directly to both the first connection portion and the second connection portion and which each extends from the first connection portion to the second connection portion to electrically connect the first connection portion and the second connection portion, the intermediate portions of all of the first plurality of strip-like intermediate portions being mutually separated from one another in the width direction and mutually extending in parallel directions;

a second plurality of strip-like intermediate portions which are each structurally connected directly to both the first connection portion and the second connection portion and extend between the first connection portion and the second connection portion to electrically connect the first connection portion and the second connection portion, the second plurality of strip-like intermediate portions being mutually separated in the width direction and mutually extending in substantially parallel directions, wherein the second plurality of strip-like intermediate portions form a mirror image of the first plurality of strip-like intermediate portions with respect to a center line of the interconnector in the width direction, wherein, in each of the first plurality of strip-like intermediate portions and second plurality of strip-like intermediate portions, each intermediate portion has a plurality of first curved portions which are curved to be concave at one side of the respective intermediate portion in the width direction, and a plurality of second curved portions which are curved to be concave at another side of the respective intermediate portion in the width direction, wherein two of the second curved portions of each intermediate portion are arranged along the length of the respective strip-like intermediate portion and are provided between two of the first curved portions along the length of the respective strip-like intermediate portion, with no first curved portion being provided between the two of the second curved portions along the length of the respective strip-like intermediate portion, and wherein only end portions of the interconnector are structurally fixed to either of the first electronic device element or the second electronic device element through the first interconnection portion or the second interconnection portion, wherein a combined value of a third power of the radius of curvature of the first curved portion and a third power of the radius of curvature of the second curved portion is equal in each intermediate portion of the first plurality of intermediate portion, and wherein the intermediate portions each have a straight line portion between one first curved portion and a second curved portion, which straight line portions run in the width direction, and the length of the straight line portions in all of the intermediate portions is equal.

4. A solar cell device including the interconnector according to claim 1, comprising the first electronic device element and the second electronic device element connected electrically to each other through the interconnector.

5. The interconnector according to claim 1, wherein each of the first and second electronic device elements is a solar cell.

6. An interconnector according to claim 3, wherein an angle formed between a straight line that connects a start point and a center of curvature and a straight line that connects an end point and the center of curvature is equal in the first curved portion and the second curved portion of each intermediate portion of the first plurality of intermediate portions.

7. A solar cell device including the interconnector according to claim 3, comprising the first electronic device element and the second electronic device element connected electrically to each other through the interconnector.

8. The interconnector according to claim 3, wherein each of the first and second electronic device elements is a solar cell.

9. The interconnector according to claim 1, wherein the intermediate portions of all of the first and second pluralities of strip-like intermediate portions are mutually separated from one another in the width direction, to form a gap therebetween.

10. The interconnector according to claim 3, wherein the intermediate portions of all of the first and second pluralities of strip-like intermediate portions are mutually separated from one another in the width direction, to form a gap therebetween.

* * * * *